US010934161B2

(12) United States Patent
Fukumitsu et al.

(10) Patent No.: US 10,934,161 B2
(45) Date of Patent: Mar. 2, 2021

(54) MEMS DEVICE AND METHOD FOR PRODUCING SAME

(71) Applicant: Murata Manufacturing Co., Ltd., Nagaokakyo (JP)

(72) Inventors: Masakazu Fukumitsu, Nagaokakyo (JP); Shuhei Yamada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 583 days.

(21) Appl. No.: 15/865,691

(22) Filed: Jan. 9, 2018

(65) Prior Publication Data

US 2018/0127268 A1  May 10, 2018

Related U.S. Application Data

(63) Continuation of application No. PCT/JP2016/077174, filed on Sep. 14, 2016.

(30) Foreign Application Priority Data

Sep. 17, 2015  (JP) .............................. JP2015-184289

(51) Int. Cl.
*H03H 9/10* (2006.01)
*B81C 1/00* (2006.01)
(Continued)

(52) U.S. Cl.
CPC ........ *B81C 1/00269* (2013.01); *B81B 7/0077* (2013.01); *H01L 23/02* (2013.01);
(Continued)

(58) Field of Classification Search
CPC .............. B81C 1/0269; B81C 1/00277; B81C 2203/0118; B81C 2203/0355;
(Continued)

(56) References Cited

U.S. PATENT DOCUMENTS 8,592,285 B2   11/2013  Noda et al.
8,652,865 B2    2/2014  Karlin et al.
(Continued)

FOREIGN PATENT DOCUMENTS

JP        5021098 B2     9/2012
JP      2013-39660 A     2/2013
(Continued)

OTHER PUBLICATIONS

International Search Report issued in International Application No. PCT/JP2016/077174, dated Nov. 8, 2016.
(Continued)

*Primary Examiner* — J. San Martin
(74) *Attorney, Agent, or Firm* — Arent Fox LLP

(57) ABSTRACT

A MEMS device that includes a lower substrate having an element region on a surface thereof; an upper substrate opposed to the lower substrate; and a bonding section that bonds the lower substrate and the upper substrate to each other around the periphery of the element region. The bonding section has a first region, a second region, and a third region which are sequentially provided in this order from a side closer to the element region to a side farther from the element region. At least one of the first region and the third region contains a hyper-eutectic alloy of one of a first component and a second component, and the second region contains a eutectic alloy of the first component and the second component.

10 Claims, 8 Drawing Sheets

(51) Int. Cl.
*H01L 23/02* (2006.01)
*B81B 7/00* (2006.01)
*H03H 3/007* (2006.01)
*H03H 9/24* (2006.01)

(52) U.S. Cl.
CPC ........ *H03H 3/0072* (2013.01); *H03H 9/1057* (2013.01); *H03H 9/2405* (2013.01); *B81B 2201/0271* (2013.01); *B81B 2207/095* (2013.01); *B81C 2203/0118* (2013.01); *B81C 2203/035* (2013.01); *B81C 2203/036* (2013.01)

(58) Field of Classification Search
CPC ...... B81C 2203/036; B81B 2201/0271; B81B 7/0077; B81B 2207/095; H03H 9/2405; H03H 9/1057; H03H 9/0072
See application file for complete search history.

(56) References Cited

U.S. PATENT DOCUMENTS

| | | | | |
|---|---|---|---|---|
| 9,290,376 | B1* | 3/2016 | Cheng | B81C 1/00238 |
| 2010/0059835 | A1* | 3/2010 | Martin | H01L 23/10 |
| | | | | 257/417 |
| 2010/0072563 | A1* | 3/2010 | Sato | B81B 7/007 |
| | | | | 257/415 |
| 2010/0148341 | A1* | 6/2010 | Fuji | H01L 24/16 |
| | | | | 257/686 |
| 2012/0074816 | A1* | 3/2012 | Mizusawa | H03H 9/1035 |
| | | | | 310/344 |
| 2012/0306032 | A1 | 12/2012 | Noda et al. | |
| 2012/0313246 | A1* | 12/2012 | Chiu | B81C 1/00269 |
| | | | | 257/762 |
| 2012/0319220 | A1* | 12/2012 | Noda | B81C 1/00269 |
| | | | | 257/416 |
| 2013/0043564 | A1 | 2/2013 | Karlin et al. | |
| 2013/0187245 | A1* | 7/2013 | Chien | B81C 1/00269 |
| | | | | 257/415 |
| 2013/0193527 | A1* | 8/2013 | Chu | B81B 7/007 |
| | | | | 257/414 |
| 2013/0285248 | A1* | 10/2013 | Yin | H01L 23/49866 |
| | | | | 257/762 |
| 2014/0145244 | A1* | 5/2014 | Daneman | B81C 3/001 |
| | | | | 257/254 |
| 2016/0137492 | A1* | 5/2016 | Cheng | B81C 1/00238 |
| | | | | 257/415 |

FOREIGN PATENT DOCUMENTS

| | | |
|---|---|---|
| JP | 2013-52449 A | 3/2013 |
| JP | 2013-228256 A | 11/2013 |
| WO | WO 2010/032821 A1 | 3/2010 |
| WO | WO 2011/070627 A1 | 6/2011 |
| WO | WO 2011/111540 A1 | 9/2011 |

OTHER PUBLICATIONS

Written Opinion of the International Searching Authority issued in International Application No. PCT/JP2016/077174, dated Nov. 8, 2016.

* cited by examiner

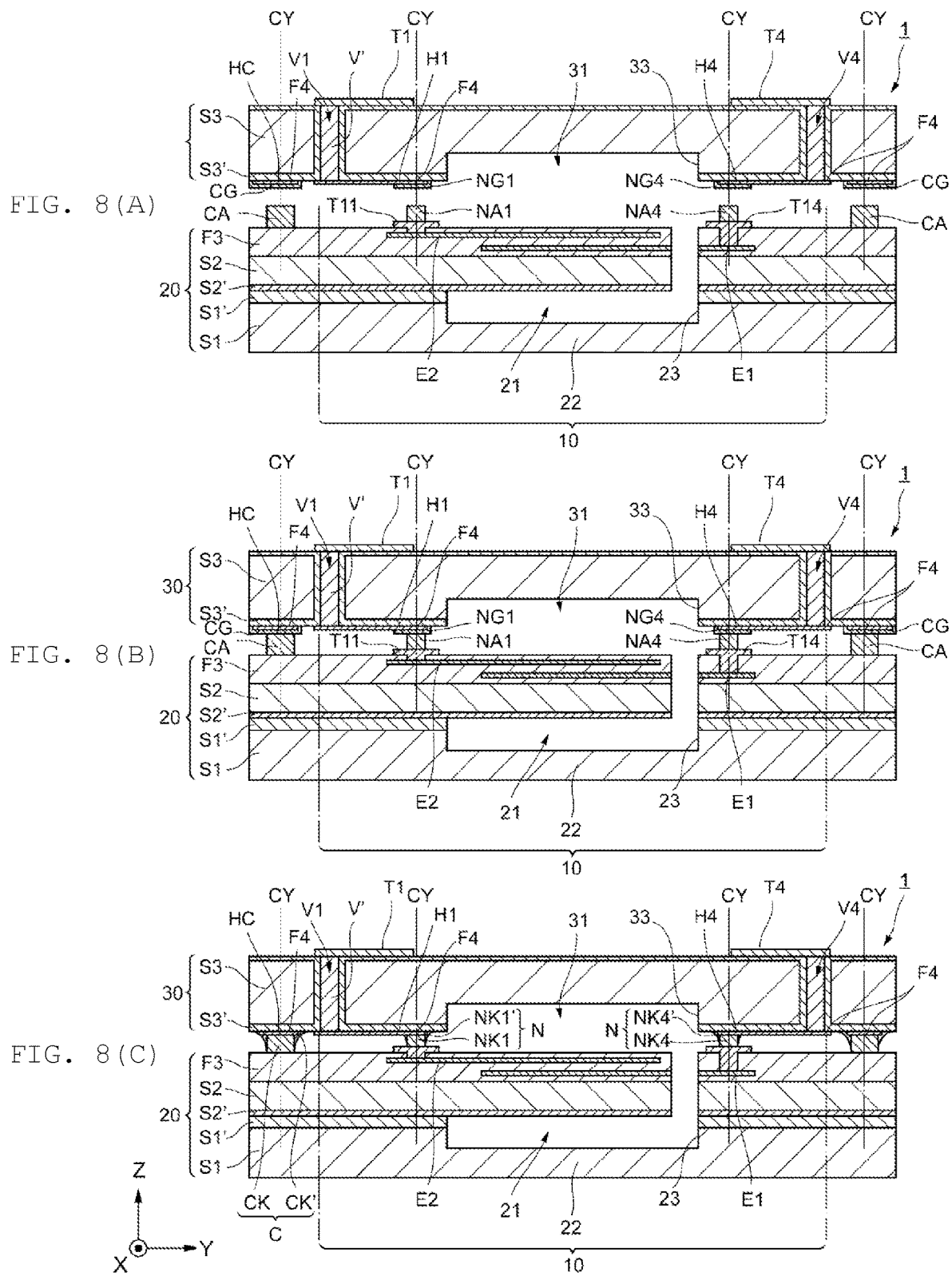

MEMS DEVICE AND METHOD FOR PRODUCING SAME

CROSS REFERENCE TO RELATED APPLICATIONS

The present application is a continuation of International application No. PCT/JP2016/077174, filed Sep. 14, 2016, which claims priority to Japanese Patent Application No. 2015-184289, filed Sep. 17, 2015, the entire contents of each of which are incorporated herein by reference.

FIELD OF THE INVENTION

The present invention relates to a MEMS device, and a method for producing the MEMS device.

BACKGROUND OF THE INVENTION

In recent years, devices produced using a Micro Electro Mechanical Systems (MEMS) technique in which a mechanical element component, a sensor, an actuator, and an electronic circuit are integrated on one silicon substrate, glass substrate, organic material, or the like have come into wide use. In the MEMS device technique, an upper substrate is bonded to a lower substrate provided with a semiconductor element having a multilayer structure.

For example, Patent Document 1 discloses a method for bonding upper and lower substrates by binary eutectic bonding with germanium and aluminum. In the method described in Patent Document 1, an aluminum-containing layer and a germanium layer are interposed in a polymerized state between the bonding surfaces of a first semiconductor substrate and a second semiconductor substrate, and the bonding surfaces are subjected to a heating/pressurization treatment to eutectic-bond the first semiconductor substrate and the second semiconductor substrate to each other. In the method described in Patent Document 1, here the outer end of the germanium layer is formed on the inner side with respect to the outer end of the aluminum-containing layer to prevent protrusion of the eutectic alloy from the bonding surface.

Patent Document 1: Japanese Patent No. 5021098

SUMMARY OF THE INVENTION

When the eutectic alloy protrudes from the bonding surface, the eutectic alloy is electrically connected to wiring on a semiconductor element placed on the lower substrate. Aluminum, etc., to be used in a conventional bonding method as described in Patent Document 1 is easily migrated by pressurization or heating. Therefore, in the bonding method described in Patent Document 1, the aluminum, etc., may be migrated in pressurization of the bonding surface. Here, the aluminum, etc., protrudes from the bonding surface, and is electrically connected to the wiring on the semiconductor element.

The present invention has been made in view of such circumstances, and an object of the present invention is to prevent protrusion of a metal from a bonding surface in eutectic bonding.

A MEMS device according to one aspect of the present invention includes: a lower substrate having an element region on a surface thereof; an upper substrate provided so as to be opposed to the lower substrate; and a bonding section that bonds the lower substrate and the upper substrate to each other around the periphery of the element region. The bonding section has a first region, a second region, and a third region which are sequentially provided in this order from a side closer to the element region to a side farther from the element region. At least one of the first region and the third region contains a hyper-eutectic alloy of one of a first component and a second component, which has a higher melting point than a eutectic point of the first component and the second component, and the second region contains a eutectic alloy of the first component and the second component.

According to the MEMS device, it is possible to prevent protrusion of a metal from a bonding surface in eutectic bonding.

In addition, it is preferable that the first region and the third region have the hyper-eutectic alloy. In this preferred aspect, it is possible to prevent protrusion of a metal from a bonding surface in eutectic bonding.

In addition, it is also preferable that the first component and the second component have a eutectic point at 400° C. to 600° C., and one of the first component and the second component has a melting point of higher than 600° C. In this preferred aspect, a heating temperature for causing a eutectic reaction can be reduced, so that damage to elements such as wiring to be used in a MEMS device can be reduced.

The first component is preferably aluminum. An alloy containing aluminum as a component is a metal that is often used for, for example, wiring in a MEMS device or the like. Thus, in this preferred aspect, contamination of a silicon substrate of a MEMS device in the production process can be reduced by using aluminum for the bonding section. In particular, the second component is preferably one of germanium and silicon.

In addition, it is also preferable that the MEMS device further includes a height adjustment section between the bonding section and the lower substrate or the upper substrate. In this preferred aspect, it is possible to adjust the spacing between the lower substrate and the upper substrate.

A method for producing a MEMS device according to one aspect of the present invention includes: providing a lower substrate having an element region on a surface thereof, and an upper substrate; forming a first layer including a first component around the periphery of element region on the lower substrate, and forming a second layer including a second component at a position opposite to the first layer on the upper substrate; opposing the lower substrate and the upper substrate to each other, and bringing the first layer and the second layer into contact with each other; pressing the upper substrate and the lower substrate together; and heating the first layer and the second layer at a temperature which is equal to or higher than the eutectic point of the first component and the second component and which is lower than the melting point of one of the first component and the second component, which has a higher melting point than the eutectic point. One of the first layer and the second layer is formed in such a manner that at least one of a first region provided at a position close to the element region and a second region provided at a position far from the element in the one layer are not in contact with the other layer when the first layer and the second layer are brought into contact with each other.

According to the method for producing a MEMS device, it is possible to prevent protrusion of a metal from a bonding surface in eutectic bonding.

It is preferable that one of the first layer and the second layer is formed in such a manner that the first region and the second region are not in contact with the other layer. In this preferred aspect, it is possible to prevent protrusion of a metal from a bonding surface in eutectic bonding.

In addition, it is also preferable that a third layer, which includes a third component that does not undergo a eutectic reaction with one of the first component and the second component, is formed at one of a position where the first layer is formed in the lower substrate and a position where the second layer is formed in the upper substrate, and stacking one of the first layer and the second layer on the third layer. In this preferred aspect, it is possible to adjust the spacing between the lower substrate and the upper substrate.

In addition, it is also preferable that the first component and the second component have a eutectic point at 400° C. to 600° C., and one of the first component and the second component has a melting point of higher than 600° C. In this preferred aspect, a heating temperature for causing a eutectic reaction can be reduced, so that damage to elements such as wiring to be used in a MEMS device can be reduced.

The first component is preferably aluminum. An alloy containing aluminum as a component is a metal that is often used for, for example, wiring in a MEMS device or the like. Thus, in this preferred aspect, contamination of a silicon substrate of a MEMS device in the production process can be reduced by using aluminum for the bonding section. In particular, the second component is preferably one of germanium and silicon.

According to the present invention, it is possible to prevent protrusion of a metal from a bonding surface in eutectic bonding.

BRIEF EXPLANATION OF THE DRAWINGS

FIGS. 8(A) to 8(C) show a process flow corresponding to FIGS. 6(A) to 6(C) and showing the MEMS device according to the second embodiment of the present invention.

DETAILED DESCRIPTION OF THE INVENTION

First Embodiment

Figure 1:
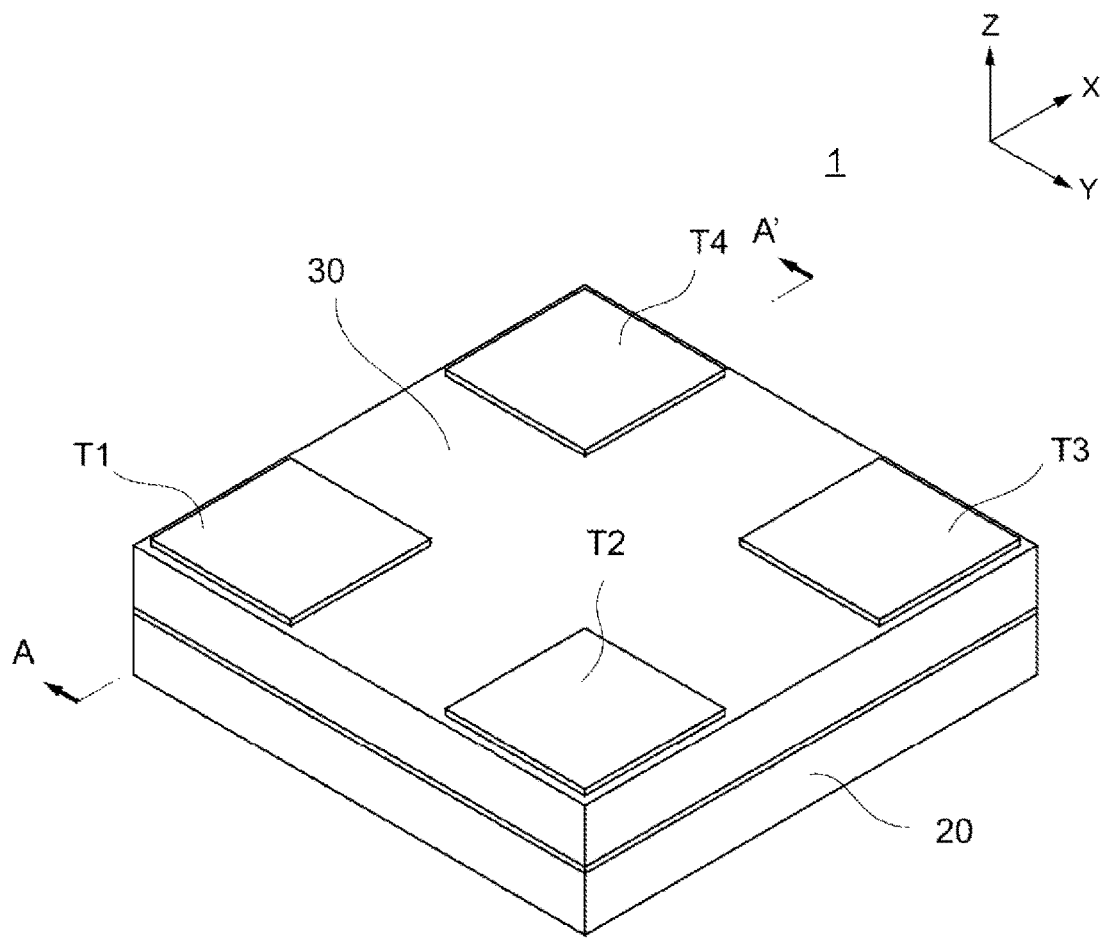
FIG. 1 is a perspective view schematically showing a structure of a MEMS device according to a first embodiment of the present invention.
Figure 2:
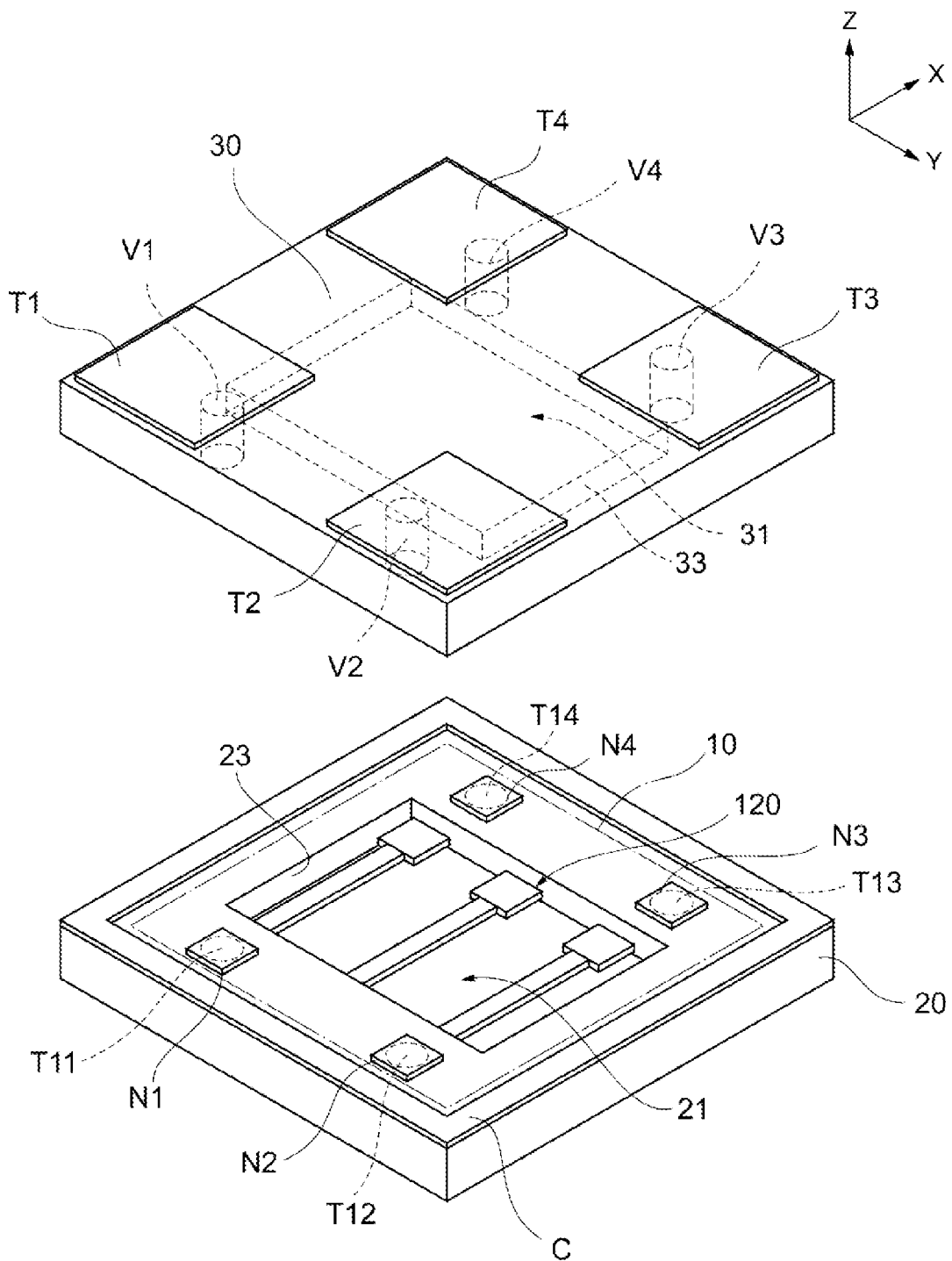
FIG. 2 is an exploded perspective view schematically showing the structure of the MEMS device according to the first embodiment of the present invention.

Hereinafter, a first embodiment of the present invention will be described with reference to the accompanying drawings. FIG. 1 is a perspective view schematically showing an external appearance of a MEMS device 1 according to a first embodiment of the present invention. In addition, FIG. 2 is an exploded perspective view schematically showing a structure of the MEMS device 1 according to the first embodiment of the present invention.

The MEMS device 1 includes a lower lid 20, an upper lid 30 provided so as to be opposed to the lower lid 20, and a bonding section C sandwiched between the lower lid 20 and the upper lid 30. That is, the MEMS device 1 is formed by stacking the lower lid 20, the bonding section C, and the upper lid 30 in this order.

The lower lid 20 and the upper lid 30 are each formed using a Si substrate. The lower lid 20 and the upper lid 30 are bonded to each other by bonding the Si substrates to each other with the bonding section C. The lower lid 20 may be formed using a SOI substrate.

In this embodiment, the MEMS device 1 is a MEMS resonance device having a resonator 120. Hereinafter, the components of the MEMS device 1 will be described in detail.

(1. Upper Lid 30)

The upper lid 30 extends in a flat plate shape along the XY plane, and in this embodiment, for example, a flat rectangular solid-shaped recess portion 31 is formed on the back surface of the upper lid 30. The recess portion 31 is surrounded by a lateral wall 33, and forms a part of a vibration space that is a space in which the later-described resonator 120 vibrates.

Terminals T1 to T4 are formed on the four corners, respectively, of a surface of the upper lid 30. Vias V1 to V4 are formed below the terminals T1 to T4, and filled with a conductive material, so that the terminals T1 to T4 function as terminals for connecting electrodes T11 to T14 as described later to an external power supply through connection sections N1 to N4.

(2. Lower Lid 20)

The lower lid 20 has a rectangular flat plate-shaped bottom plate 22 (see FIG. 4) provided along the XY plane, and a lateral wall 23 extending in the Z axis direction (i.e., a stacking direction of the lower lid 20 and the upper lid 30) from the peripheral edge portion of the bottom plate 22. For example, in the lower lid 20, a recess portion 21 formed by the surface of the bottom plate 22 and the inner surface of the lateral wall 23 is provided on the surface opposed to the upper lid 30. The recess portion 21 forms a part of a vibration space of the later-described resonator 120.

In addition, an element region 10 is provided at the center of the lower lid 20. In the element region 10, for example, a MEMS resonator, gyro sensor, temperature sensor, or the like produced using a MEMS technique is formed. In this embodiment, the resonator 120 is formed on the surface of the element region 10. The resonator 120 is a resonator that vibrates in a vibration space.

In the element region 10, four electrodes T11 to T14 are further formed at positions opposed to the terminals T1 to T4, respectively. For example, the resonator 120 has wiring connected to the electrodes T11 to T14.

(3. Bonding Section C)

In this embodiment, the bonding section C is formed in a rectangular frame shape along the XY plane between the lower lid 20 and the upper lid 30 on the periphery of the element region 10. The bonding section C bonds the lower lid 20 and the upper lid 30 to each other by forming a eutectic alloy. In this embodiment, the lower lid 20 and the upper lid 30 are bonded by the bonding section C to form, for example, a vibration space of the resonator 120. This vibration space is airtightly sealed, so that a vacuum state is maintained. The vibration space may be filled with a gas such as, for example, an inert gas.

In this embodiment, the bonding section C is formed of aluminum and germanium.

Figure 3A:
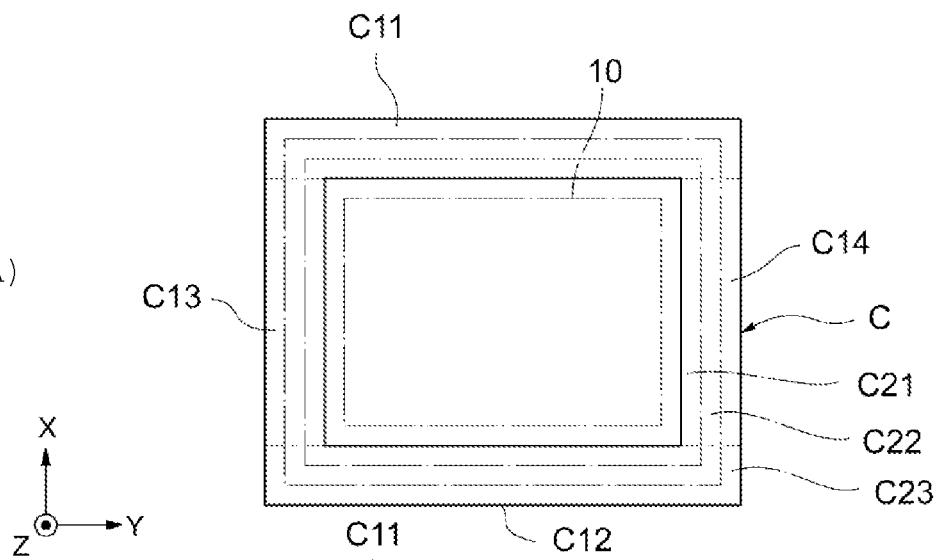
FIGS. 3(A) to 3(C) are plan views each schematically showing one example of a shape of a bonding section in a MEMS device according to the present invention.
Figure 3B:
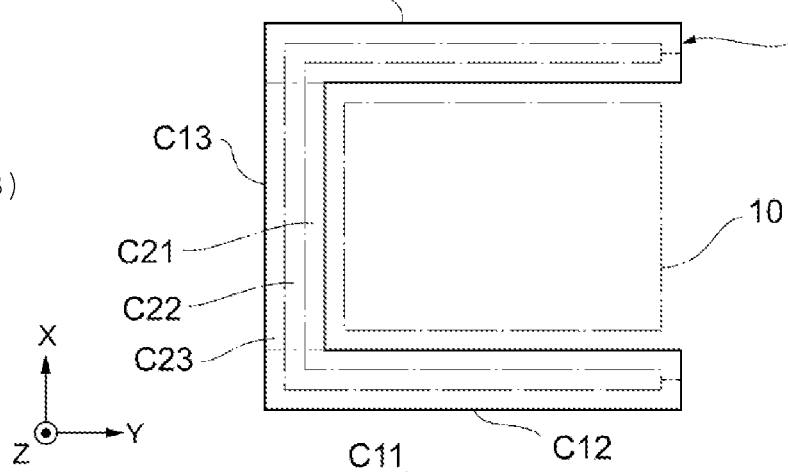
Figure 3C:
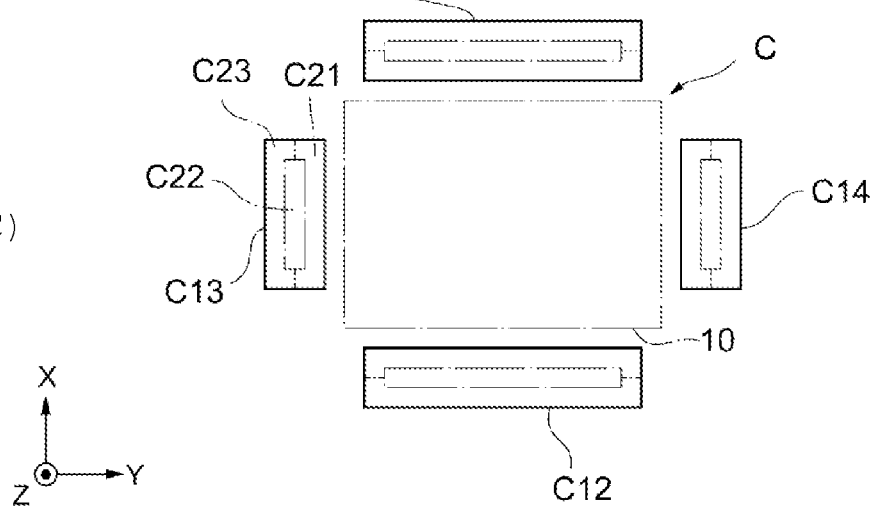

FIGS. 3(A) to 3(C) are plan views schematically showing one example of the shape and arrangement of the bonding section C formed in the MEMS device 1. FIGS. 3(A) to 3(C) illustrate the bonding section C and the element region 10 of the MEMS device 1. Specifically, FIG. 3(A) is a plan view schematically showing the bonding section C and the element region 10 according to this embodiment.

FIGS. 3(B) and 3(C) are views schematically showing other shapes of the bonding section C.

FIGS. 3(A) to 3(C) illustrate, as an example, the element region 10 which is formed in a substantially rectangular shape and which has a long side in the Y-axis direction and a short side in the X-axis direction.

As shown in FIG. 3(A), the bonding section C in this embodiment surrounds the element region 10 without a break. In addition, the bonding section C has a first region C21, a second region C22, and a third region C23, which are sequentially provided in this order from a side closer to the element region 10 to a side farther from the element region 10.

In the example in FIG. 3(A), the second region C22 is formed in the vicinity of the central part of the bonding section C along the outer periphery of the element region 10. In addition, the first region C21 is formed along the second region C22 at a position closer to the element region 10 than the second region C22. On the other hand, the third region C23 is formed along the second region C22 at a position farther from the element region 10 than the second region C22.

In FIGS. 3(B) and 3(C), the bonding section C is provided on the periphery of the element region 10, and formed so as to surround a part of the element region 10. In the example in FIG. 3(B), the bonding section C is formed so as to surround three sides of the periphery of the element region 10.

In an example of the bonding section C as shown in FIG. 3(B), the second region C22 is provided in the vicinity of the center portion of the bonding section C along the outer periphery of the element region 10. In addition, the first region 21 is formed along the second region C22 at a part closer to the element region 10 than the second region C22 in the bonding section C. In addition, the third region C23 is formed along the second region C22 at a part farther from the element region 10 than the second region C22 in the bonding section C.

In FIG. 3(C), the bonding section C includes four bonding sections C11 to C14 interspersed on the periphery of the element region 10. The bonding sections C11 to C14 are not mutually connected, but each surround a part of each of the four sides of the element region 10. Therefore, the bonding section C is not formed on the periphery of the corner of the element region 10.

In the example in FIG. 3(C), the second region C22 is provided in the vicinity of the central part of the bonding section C along a side opposed to the second region C22 in the element region 10. In addition, the first region C21 is formed along the second region C22 at a part closer to the element region 10 than the second region C22 in the bonding section C. In addition, the third region C23 is formed along the second region C22 at a part farther from the element region 10 than the second region C22 in the bonding section C.

(4. Laminated Structure)

Figure 4:
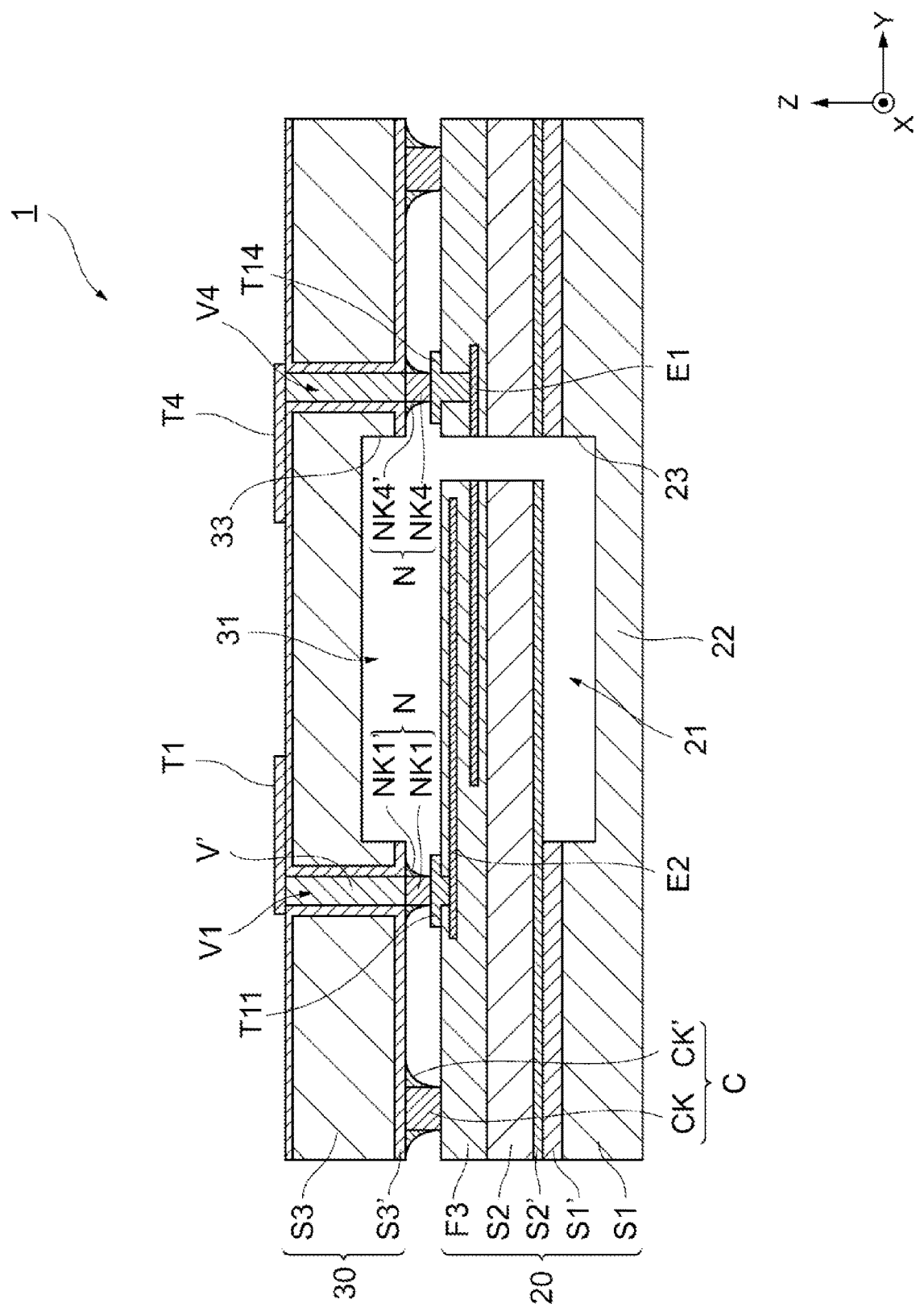
FIG. 4 is a sectional view taken along line A-A' in FIG. 1.

The laminated structure of the MEMS device 1 will be described with reference to FIG. 4. FIG. 4 is a sectional view taken along line A-A' in FIG. 1.

As shown in FIG. 4, the lateral wall 33 of the upper lid 30 is bonded onto the lateral wall 23 of the lower lid 20 in the MEMS device 1 according to this embodiment. In this embodiment, the recess portion 21 of the lower lid 20 and the recess portion 31 of the upper lid 30 form a vibration space in which the resonator 120 vibrates.

The bottom plate 22 and the lateral wall 23 of the lower lid 20 are integrally formed by a Si (silicon) substrate S1, and a silicon oxide (e.g., $SiO_2$) film S1' is formed on the upper surface of the lateral wall 23. The thickness of the lower lid 20 defined in the Z-axis direction is, for example, 150 μm, and the depth of the recess portion 21 is, for example, 50 μm.

On the silicon oxide film S1', a silicon layer S2 is formed. A Si layer S2 is formed of, for example, a degenerate n-type Si semiconductor having a thickness of about 10 μm, and may contain P (phosphorus), As (arsenic), Sb (antimony) or the like as an n-type dopant. The resistance value of the degenerate Si to be used in the Si layer S2 is preferably 0.5 mΩ·cm or more and 0.9 mΩ·cm or less. In this embodiment, a silicon oxide layer S2' is formed on the lower surface of the Si layer S2. Accordingly, it is possible to improve the temperature characteristic of the resonator 120.

On the Si layer S2, a piezoelectric thin film F3 is formed so as to cover the Si layer S2, and further a metal layer E1 is stacked on the piezoelectric thin film F3. On the metal layer E1, the piezoelectric thin film F3 is stacked so as to cover the metal layer E1, further a metal layer E2 is stacked on the piezoelectric thin film F3, and again, the piezoelectric thin film F3 is stacked on the metal layer E2. The metal layers E1 and E2 are formed using, for example, Mo (molybdenum) or aluminum (Al) in a thickness of about 0.1 μm. When the Si layer S2 is formed from degenerated Si, the Si film S2 can also serve as the metal layer E1.

The metal layers E1 and E2 are formed into a desired shape by etching or the like. The metal layer E1 is formed so as to function as a lower electrode in the resonator 120.

On the other hand, the metal layer E2 is formed so as to function as an upper electrode in the resonator 120. In addition, the metal layers E1 and E2 are formed so as to function as wiring for connecting the lower electrode and the upper electrode to the electrodes T11 to T14 in a region other than the resonator 120.

The piezoelectric thin film F3 is a thin film of a piezoelectric body that converts an applied voltage into a vibration, and may be mainly composed of, for example, a nitride such as AlN (aluminum nitride), or an oxide. Specifically, the piezoelectric thin film 128 can be formed of ScAlN (scandium aluminum nitride). ScALN is obtained by replacing a part of aluminum in aluminum nitride with scandium.

In addition, the piezoelectric thin film F3 has a thickness of, for example, 1 μm.

The piezoelectric thin film F3 expands and contracts, for example, in the out-of-plane direction of the XY plane, i.e., the Z-axis direction according to an electric field applied to the piezoelectric thin film F3 by the metal layers E2 and E1. Due to the expansion and contraction of the piezoelectric thin film F3, the resonator 120 vibrates, for example, toward the inner surfaces (recess portions 21 and 31) of the lower lid 20 and the upper lid 30 in an out-of-plane bending vibration mode.

Further, in a part of the piezoelectric thin film F3, a via is formed by etching or the like to expose the metal layers E1 and E2 as shown in FIG. 4. The via (i.e., a portion where the piezoelectric thin film F3 is removed) is filled with a conductive material such as, for example, molybdenum or aluminum to form the electrodes T11 to T14. The electrodes T11 to T14 are connected to the terminals T1 to T4 through connection sections N1 to N4 as described later. In this embodiment, the electrodes T11 to T14 are formed of aluminum.

The upper lid 30 is formed by a Si substrate S3 having a predetermined thickness. As shown in FIG. 4, the upper lid 30 is bonded to the lateral wall 23 of the lower lid 20 at a peripheral portion of the upper lid 30 (lateral wall 33). Between the peripheral edge portion of the upper lid 30 and the lower lid 20, the bonding section C is formed in order to bond the upper lid 30 and the lower lid 20 to each other. A surface of the Si substrate S3 is covered with an insulating film S3'. The insulating film S3' is formed on a surface of the Si substrate S3 by, for example, oxidation of the surface of the Si substrate S3 or chemical vapor deposition (CVD).

Vias V1 to V4 are formed on the upper lid 30 at positions where the terminals T1 to T4 are formed, respectively. The insulating film S3' is formed in the vias V1 to V4, and the inside of the insulating film S3' is filled with a conductive material V'. For example, a metal such as gold (Au) or aluminum (Al) is formed on the Si substrate S3 to bond the terminals T1 to T4 to the vias V1 to V4.

The bonding section C has a eutectic section CK formed in the central part in the X-axis direction or the Y-axis direction (second region C22 in FIG. 3(A)), and a hyper-eutectic section CK' (first region C21 and third region C23 in FIG. 3(A)) sequentially provided in the X-axis direction or the Y-axis direction from the eutectic section CK. That is, the bonding section C has a hyper-eutectic section CK' at the end part in the X-axis direction or the Y-axis direction in the sectional view of FIG. 4. The bonding section C may have a configuration in which at least one of the first region C21 and the third region C23 has a hyper-eutectic section CK', and the other region and the first region C21 have a eutectic section CK.

Preferably, the bonding section C has a eutectic point in a range of 400° C. or higher and 600° C. or lower, and is formed of a combination of metals which shows a binary eutectic reaction in which a part of the liquidus temperature of one component exceeds 600° C. (i.e., the melting point exceeds 600° C.). Accordingly, a heating temperature for causing a eutectic reaction can be reduced, so that damage to elements such as wiring to be used in a MEMS device 1 can be reduced.

For example, the other component is preferably an alloy mainly composed of aluminum (Al), such as an AlCu (the weight ratio of Cu is about 0.5%) alloy (aluminum-copper alloy), or an AlSiCu alloy (aluminum-silicon-copper alloy). Since aluminum is a metal that is often used for, for example, wiring in a MEMS device or the like, contamination of the silicon substrate of the MEMS device 1 in a production process can be reduced by using aluminum for the bonding section C. Here, one component of the bonding section C is preferably silicon (Si) or germanium (Ge).

In this embodiment, the bonding section C is formed of a combination of aluminum and germanium. In the eutectic section CK, aluminum and germanium are formed by a eutectic reaction. The eutectic section CK is, for example, a region in which aluminum and germanium form a eutectic, and the eutectic state thereof is substantially constant.

In addition, the hyper-eutectic section CK' is a region having a higher weight ratio of germanium as compared to the eutectic section CK in the bonding section C. The hyper-eutectic section CK' is a portion where a structure derived from a solid solution of germanium is precipitated on a eutectic structure of aluminum and germanium in observation of a cross-section of the bonding section C with a SEM (scanning electron microscope) or the like.

The thickness of the hyper-eutectic section CK' is not necessarily constant as going from the upper lid 30 to the lower lid 20, and the hyper-eutectic section CK' may be formed in such a manner that the thickness thereof is reduced as going from the upper lid 30 to the lower lid 20 as shown in FIG. 4. The weight ratio of germanium and aluminum in the hyper-eutectic section CK' is not necessarily constant. For example, the hyper-eutectic section CK' may have a region in which germanium remains alone, or a region in which the weight ratio of germanium sequentially or gradually changes. In addition, the bonding section C may have a configuration in which only a surface of the eutectic section CK on the element region 10 side has the hyper-eutectic section CK'.

FIG. 4 schematically illustrates the bonding section C having a configuration in which the eutectic section CK and the hyper-eutectic section CK' are sequentially formed, but the configuration of the bonding section C is not limited thereto. For example, the bonding section C may have a configuration in which between the eutectic section CK and the hyper-eutectic section CK', a region is present where the weight ratio of germanium sequentially or gradually changes.

When the second region C22 in FIG. 3 is exposed to a surface of the bonding section C (e.g., FIGS. 3(B) and 3(C)), the hyper-eutectic section CK' may be formed on the exposed surface in the second region C22. Specifically, when the bonding section C has a configuration as shown in FIG. 3(B), the end part of the bonding section C in the Y-axis direction is covered with the hyper-eutectic section CK'. In addition, when the bonding section C has a configuration as shown in FIG. 3(C), the end part of each of the bonding sections C11 to C14 in the longitudinal direction is covered with the hyper-eutectic section CK'.

Connection sections N1 and N4 are formed between the conductive material V' of the upper lid 30 and the electrodes T11 and T14, respectively, of the lower lid 20. A eutectic section NK of, for example, aluminum (Al) and germanium (Ge) is formed at the central part of the connecting section N in the Y-axis direction. A surface of the eutectic section NK is covered with a hyper-eutectic section NK'. The configurations of the eutectic section NK and the hyper-eutectic section NK' are the same as those of the eutectic section CK and the hyper-eutectic section CK'.

Figure 5:
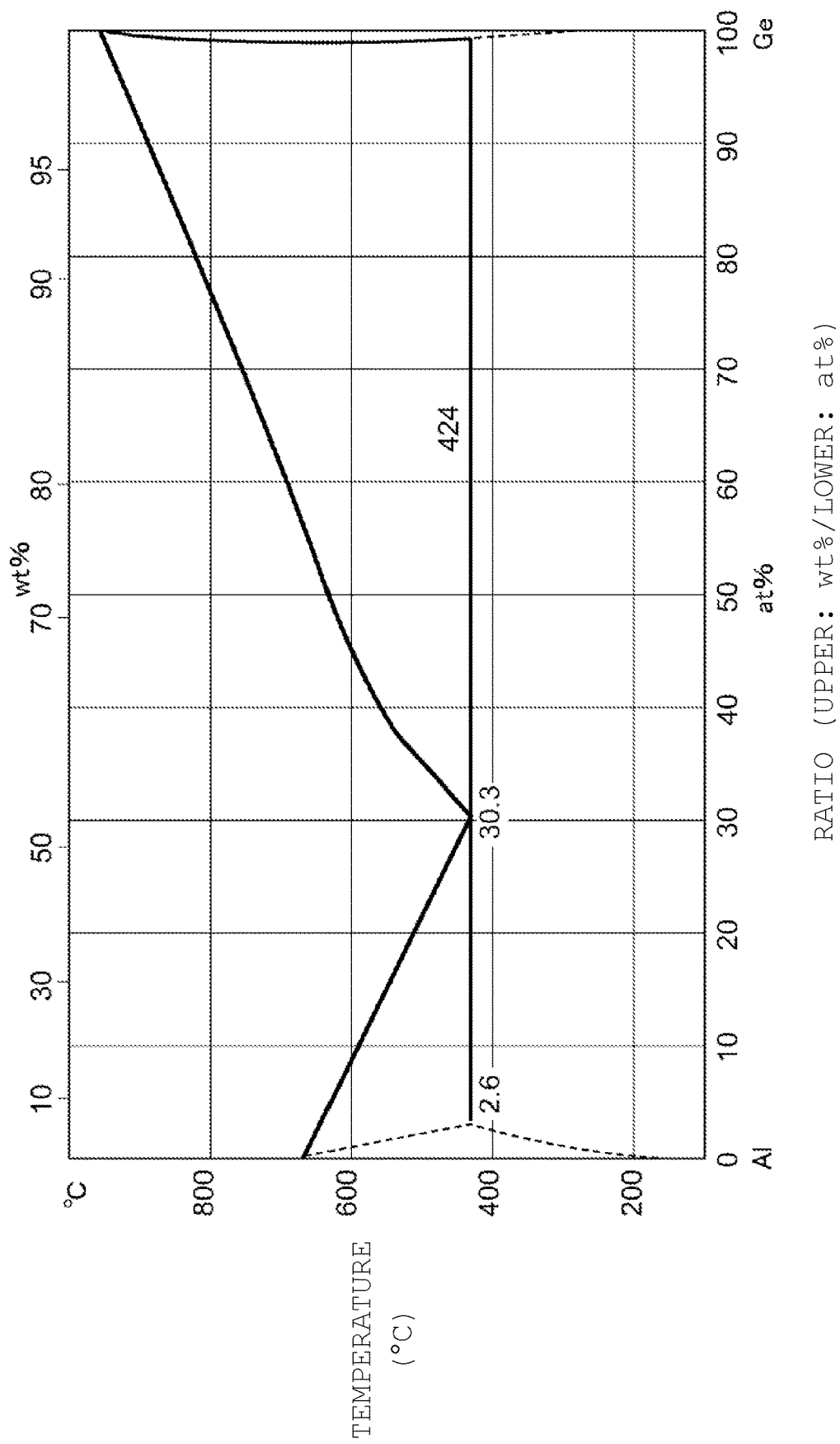
FIG. 5 is a view showing a eutectic state of germanium and aluminum according to the first embodiment of the present invention.

FIG. 5 is an equilibrium state view showing a eutectic state of aluminum and germanium. In FIG. 5, the ordinate represents a temperature at which the eutectic starts, and among the upper and lower abscissas, the upper abscissa represents a weight ratio of aluminum and germanium, and the lower abscissa represents a composition ratio of aluminum to germanium.

As shown in FIG. 5, a eutectic point at which the liquidus temperature is the lowest is obtained when the weight ratio of aluminum to germanium is 52:48 as shown in FIG. 5. For example, the eutectic sections CK and NK described above are formed such that the weight ratio of aluminum to germanium is 52:48 for ensuring the liquidus temperature is coincident with the eutectic point.

As shown in FIG. 5, the liquidus temperature increases from the eutectic point as the weight ratio of aluminum to germanium changes from 52:48. Here, as compared to aluminum, germanium has a higher ratio of increase in liquidus temperature with an increase in weight ratio. In addition, the melting point of germanium alone (e.g., about 938° C. at 1 atm) is much higher than the eutectic point temperature (e.g., about 424° C. at 1 atm).

Therefore, by forming the bonding section C in such a manner that the weight ratio of germanium is larger than 52:48 in the hyper-eutectic section CK', protrusion of a eutectic alloy by means of a difference in ratio of increase in liquidus temperature between aluminum and germanium (described later for details).

(5. Process Flow)

Figure 6:
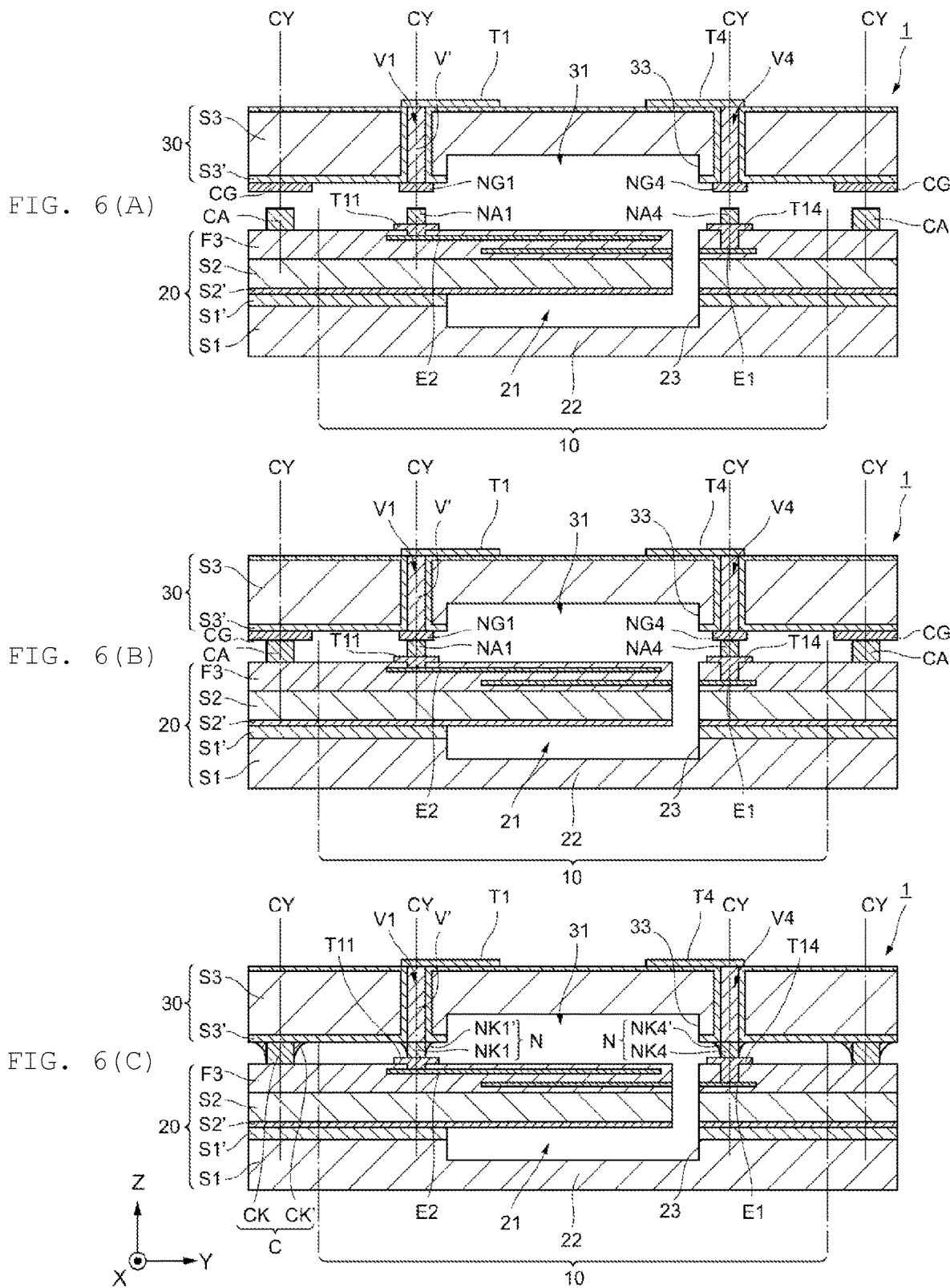
FIGS. 6(A) to 6(C) are views showing a process flow of a MEMS device according to the first embodiment of the present invention.

FIGS. 6(A) to 6(C) are views showing a process flow in production of the MEMS device 1 according to this embodiment. For the sake of convenience, FIGS. 6(A) to 6(C) illustrate one MEMS device 1 among a plurality of MEMS devices 1 formed on a wafer, but the MEMS device 1 is obtained by forming a plurality of MEMS devices on one wafer, and then dividing the wafer, similarly in the general MEMS process.

In this process flow, first the lower lid 20 provided with the resonator 120, etc., and the upper lid 30 provided with the terminals T1 to T4, etc., are provided.

In the process in FIG. 6(A), aluminum (also referred to as a "first component") is stacked on the piezoelectric thin film F3 in the provided lower lid 20. Next, the stacked aluminum is formed into a desired shape by etching or the like, so that an aluminum layer CA (also referred to as a "first layer") is formed outside the element region 10 in the lower lid 20, and aluminum layers NA1 and NA4 are formed on the electrodes T11 and T14, respectively.

On the other hand, germanium (also referred to as a "second component") is stacked on a surface of the insulating film S3' on the back surface of the upper lid 30. Next, the stacked germanium is formed into a desired shape by etching or the like, so that germanium layers CG (also referred to as a "second layer"), NG1 and NG4 (hereinafter, collectively referred to as a "germanium layer GE") are formed at predetermined positions in the upper lid 30.

For example, when the lower lid 20 and the upper lid 30 are opposed to each other so that both ends of each of the lids are provided at the same position in the Y-axis direction as the predetermined position, the germanium layer GE is formed in the upper lid 30 in such a manner that the center line CY of the germanium layer GE is substantially opposed to the center of the aluminum layers CA, NA1 and NA4 (also collectively referred to as an "aluminum layer AL").

Further, in the process in FIG. 6(A), the germanium layer CG is formed in such a manner that a part provided at a position close to the element region 10 (a part corresponding to the first region C21 of the bonding section C as shown in FIG. 3(A)) or a part provided at a position far from the element region 10 (a part corresponding to the third region C23 of the bonding section C shown in FIG. 3 (A)) in the germanium layer CG is not in contact with the aluminum layer CA. For example, the aluminum layer CA and the germanium layer CG are each formed in such a manner that a part situated on the element region 10 side in the germanium layer CG formed on the upper lid 30 is situated closer to the element region 10 than a part situated on the element region 10 side in the aluminum layer CA formed on the lower lid 20.

The germanium layer GE may be formed on the lower lid 20, and the aluminum layer AL may be formed on the upper lid 30. In any case, the aluminum layer CA and the germanium layer CG are formed in such a manner that when the lower lid 20 and the upper lid 30 are opposed so as to situate both ends of each of the lids at the same position in the Y-axis direction, a part close to the element region 10 is provided at a position closer to the element region 10 in the germanium layer CG than in the aluminum layer CA.

Further, in the process in FIG. 6(A), the aluminum layer AL and the germanium layer GE are formed in the lower lid 20 and the upper lid 30, respectively, in such a manner that the germanium layer GE has a width larger by about 10 to 15 µm than that of the aluminum layer AL in terms of a width along the Y-axis direction. In addition, the aluminum layer AL and the germanium layer GE are formed in such a manner that the aluminum layer AL has a thickness of about 0.7 µm, and the germanium layer GE has a thickness of about 0.38 µm in terms of a thickness along the Z-axis direction.

Preferably, the germanium layer GE is formed so as to have a uniform thickness from the end part to the central part in the Y-axis direction. Accordingly, the liquid phases of aluminum and germanium melted by a heating treatment as described later can be prevented from moving from the end part of the germanium layer GE to the back surface of the upper lid 30. As a result, it is possible to prevent performance defects caused by formation of an unnecessary material in the upper lid 30.

Next, in FIG. 6(B), the lower lid 20 and the upper lid 30 are aligned so that the center line CY of the aluminum layer CA in the Y-axis direction coincides with the center of the germanium layer CG in the Y-axis direction. Examples of the method for aligning the lower lid 20 and the upper lid 30 include a method in which a wafer to be provided with the lower lid 20 and a wafer to be provided with the upper lid 30 are marked, and the positions of the wafers are directly aligned, and a method in which the positions of the wafers indirectly aligned on the basis of the positions of components such as the lower lid 20 provided in the wafer.

After alignment, the upper lid 30 and the lower lid 20 are sandwiched by a heater or the like, and a heat treatment is performed. Here, the upper lid 30 is moved toward the lower lid 20, and as a result, the upper lid 30 is in contact with the lower lid 20 in such a manner that the center line CY of each of the aluminum layers AL in the Y-axis direction coincides with the center of the germanium layer GE in the Y-axis direction.

The heating temperature in the heating treatment is preferably equal to or higher than the eutectic point temperature shown in FIG. 5 and lower than the melting point of aluminum alone, i.e., about 424° C. or higher and lower than 620° C. The heating time is preferably about 10 minutes or more and 20 minutes or less. In this embodiment, the heating treatment is performed at a temperature of 450° C. or higher and 500° C. or lower for about 15 minutes.

During heating, the MEMS device 1 is pressed from the upper lid 30 to the lower lid 20 with a pressure of, for example, about 15 MPa. The pressure at which the MEMS device 1 is pressed is preferably about 5 MPa or more and 25 MPa or less.

Since the heating temperature in this embodiment is equal to or higher than the eutectic point temperature (424° C.) shown in FIG. 5, a liquid phase in which the aluminum layer AL and the germanium layer GE are melted is formed at the contact portion between these layers. Here, a pressure is applied to the contact portion between the aluminum layer AL and the germanium layer GE by a pressurization treatment. Thus, aluminum and germanium melted to form a liquid phase outflow from the contact portion toward a portion at which the germanium layer GE and the aluminum layer AL are not in contact with each other (end part of the germanium layer GE in FIG. 6(B); hereinafter, also referred to as an "end part of the germanium layer GE".

Since the heating temperature is lower than the melting point of germanium, a solid of germanium remains at the end part of the germanium layer GE. Aluminum and germanium melted to form a liquid phase outflows here, so that a solid solution in which germanium is solid-dissolved with the liquid phase of aluminum and germanium is formed at a contact portion between the outflowing aluminum and germanium as a liquid phase and the solid of germanium. As outflowing of the liquid phase of aluminum and germanium proceeds, the weight ratio of germanium contained in the liquid phase increases, leading to an increase in liquidus temperature at the above-mentioned contact portion. As a result, the liquidus temperature of the solid solution at the end part of the germanium layer GE is higher than the heating temperature, and therefore melting of the solid of germanium into the liquid phase of aluminum and germanium is stopped. Further, since a solid solution in which a solid of germanium is melted into a liquid phase of aluminum and germanium has a viscosity higher than the liquid phase, outflow of the liquid phase can be suppressed.

As a result, in the bonding section C, the hyper-eutectic section CK' having a high germanium weight ratio covers the eutectic section CK, so that it is possible to prevent protrusion of the eutectic alloy into recess portions 21 and 31.

Further, as compared to aluminum, germanium has a higher ratio of increase in liquidus temperature with an increase in weight ratio in a eutectic alloy, and therefore even when an increase in width of the germanium layer GE with respect to the aluminum layer AL is small, protrusion of the eutectic alloy from the bonding section C can be prevented. As a result, it is possible to reduce the size of the MEMS device 1.

After the heat treatment, a cooling treatment is performed by, for example, natural cooling. The cooling treatment is not limited to natural cooling as long as eutectic sections CK and NK can be formed at the bonding section, and hyper-eutectic sections CK' and NK' can be formed on the surfaces of the eutectic sections CK and NK, and the cooling temperature and the cooling rate can be variously selected.

As a result, as shown in FIG. 6(C), the outsides of the eutectic sections CK and NK are covered with the hyper-eutectic sections CK' and NK'.

Thus, with the MEMS production method according to this embodiment, the surface of the eutectic section CK can be covered with the hyper-eutectic section CK'. Accordingly, protrusion of the eutectic alloy to the electrodes T11 to T14 can be prevented.

Second Embodiment

In second and subsequent embodiments, descriptions of the same matters as in the first embodiment are omitted, and only different points will be described. Particularly, the same effects with the same configurations will not be mentioned one by one in each of the embodiments.

Figure 7:
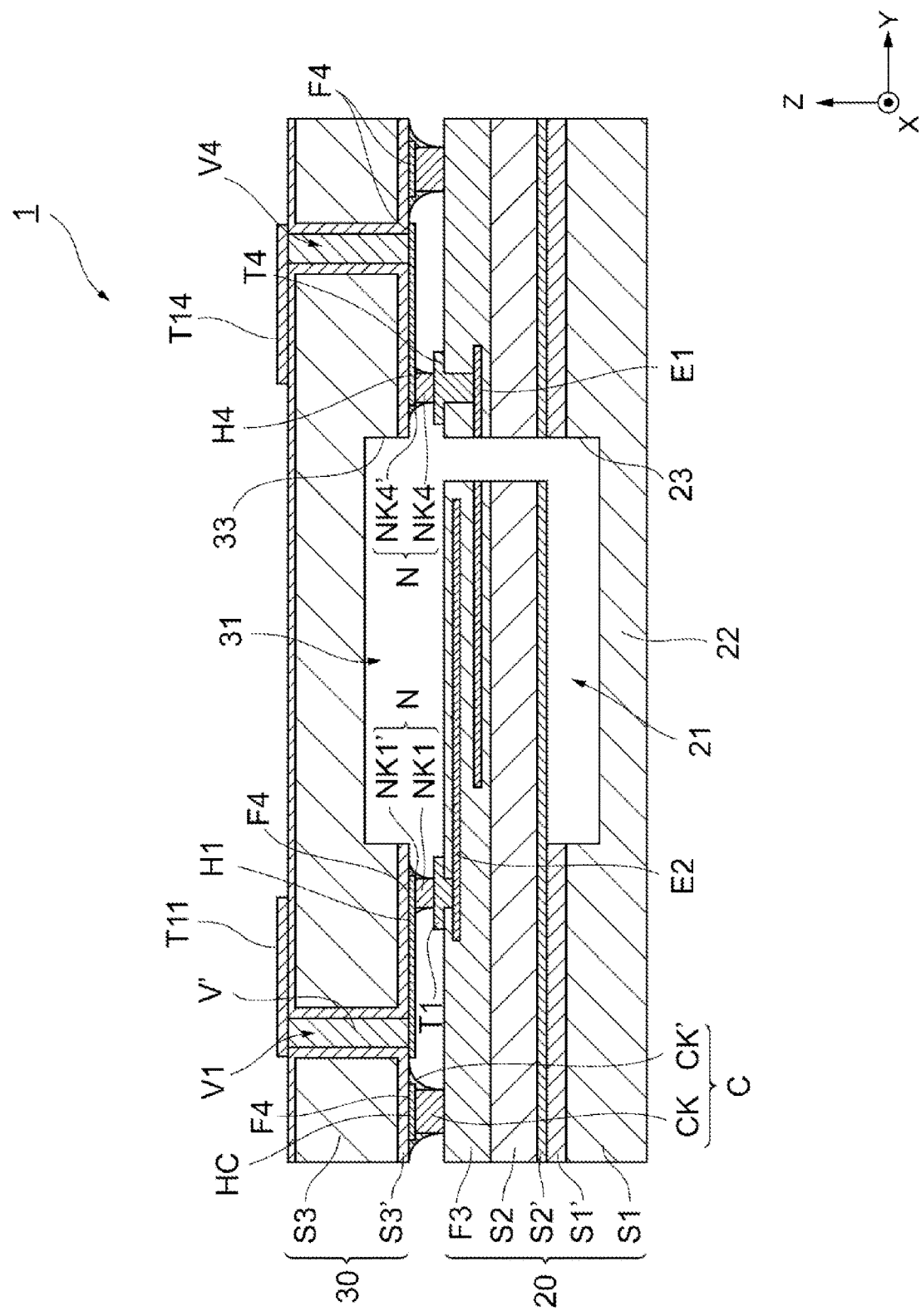
FIG. 7 is a sectional view corresponding to FIG. 4 and showing a MEMS device according to a second embodiment of the present invention.

FIG. 7 is a sectional view (see FIG. 1) taken along line A-A' of the MEMS device 1 according to this embodiment. Hereinafter, the detailed configurations of the MEMS device 1 according to this embodiment will be described mainly for matters different from those in the first embodiment. In this embodiment, terminals T1 to T4 are formed outside electrodes T11 to T14.

Connection wires H1 to H4 are formed on the back surface of an upper lid 30 so as to extend from a position opposed to the terminals T1 to T4 to a position opposed to the electrodes T11 to T14, respectively.

A height adjustment section HC as one example of a third layer is formed at a position opposed to the bonding section C on the back surface of the upper lid 30.

The connection wires H1 to H4 and the height adjustment section HC are formed of, for example, aluminum, and have, on the surfaces thereof, a layer composed of a material which does not undergo a eutectic reaction with aluminum or germanium, such as tantalum (Ta), tantalum nitride (TaN), or titanium nitride (TiN). Here, the materials which do not undergo a eutectic reaction include materials which less easily undergo a eutectic reaction with components that form eutectic sections CK and NK than components that form eutectic sections CK and NK (i.e., aluminum and germanium) undergo a eutectic reaction. Preferably, the surfaces of the connection wires H1 to H4 and the height adjustment section HC are covered with the material. In this embodiment, the surfaces of the connection wires H1 to H4 and the height adjustment section HC have titanium (Ti). Since the surfaces of the connection wires H1 to H4 and the height adjustment section HC are covered with a titanium film F4, aluminum in the connection wires H1 to H4 and the height adjustment section HC and germanium in the eutectic sections CK and NK can be prevented from undergoing a eutectic reaction with each other.

Other cross-sectional configurations are the same as in the first embodiment.

Next, the process flow for the MEMS device 1 according to this embodiment will be described.

FIGS. 8(A) to 8(C) are views showing one example of a process flow for producing the MEMS device 1 according to this embodiment.

In this embodiment, the upper lid 30 prepared in this process is one with a germanium layer GE stacked on connection wires H1 and H4 (corresponding to terminals T1 and T4) and the height adjustment section HC with the titanium film F4 interposed therebetween as shown in FIG. 8(A). The production process of the upper lid 30 provided in this embodiment is, for example, as follows. First, aluminum is stacked on a surface of an insulating film S3' on the back surface of the upper lid 30, and the connection wires H1 to H4 and the height adjustment section HC are formed by etching or the like. The height of the height adjustment section HC in the A-axis direction is substantially the same as the height of each of the connection wires H1 to H4. Thereafter, the titanium film F4 is stacked on the surfaces of the connection wires H1 to H4 and the height adjustment section HC. Further, germanium is stacked on the upper lid 30, and the germanium layer GE is formed by etching or the like.

It is preferable that in the upper lid 30 provided in this embodiment, the germanium layer GE is formed in such a manner that a portion which does not have the connection wires H1 to H4 and the height adjustment section HC on the lower surface thereof and a portion having the connection wires H1 to H4 and the height adjustment section HC on the lower surface thereof have substantially the same height in the Z-axis direction. Accordingly, even when a liquid phase of melted aluminum and germanium moves to the end part of the germanium layer GE in occurrence of a eutectic reaction, protrusion of a eutectic alloy can be suppressed because the germanium in a certain thickness remains as a solid at the end part of the germanium layer GE.

Except for the above, the process flow is the same as in the first embodiment.

Thus, the MEMS device 1 according to this embodiment has a configuration in which the bonding section C is connected to the upper lid 30 through the height adjustment section HC. Accordingly, it is possible to adjust a gap between the upper lid 30 and the lower lid 20. Other configurations and effects are the same as in the first embodiment.

In this embodiment, the connection wire H1 is electrically connected to the terminal T1, but the present invention is not limited thereto. For example, a germanium layer NG1 may be formed up to a via V1, and electrically connected to the terminal T1.

Here, the connection wire H1 may have a length that does not reach the via V1 (i.e., the connection wire H1 is formed inside the via V1). Here, the connection wire H1 functions as a height adjustment section.

The embodiments described above are intended for easily understanding the present invention, and are not construed to limit the present invention. The present invention can be changed/modified without departing from the spirit of the present invention, and equivalents thereof are also included in the present invention. That is, those with a design change appropriately made to the embodiments by those skilled in the art are also encompassed in the scope of the present invention as long as it has the feature of the present invention. For example, elements and arrangements, materials, conditions, shapes, sizes and the like of the elements in the embodiments are not limited to those shown as an example, and can be appropriately changed.

In addition, it is needless to say that the embodiments are illustrative, and it is possible to partially replace or combine the configurations shown in different embodiments, and these are also encompassed in the scope of the present invention as long as they include the feature of the present invention.

DESCRIPTION OF REFERENCE SYMBOLS

1: MEMS device
10: Element region
30: Upper lid
20: Lower lid
120: Resonator
C: Bonding section
CK: Eutectic section
CK': Hyper-eutectic section

The invention claimed is:

1. A MEMS device comprising:
 a first substrate having an element region on a surface thereof;
 a second substrate opposed to the first substrate; and
 a bonding section that bonds the first substrate and the second substrate to each other around a periphery of the element region,
 wherein
 the bonding section has a first region, a second region, and a third region which are sequentially provided in this order from a first side of the bonding section closest to the element region to a second side of the bonding section farthest from the element region,
 at least one of the first region and the third region contains a hyper-eutectic alloy of one of a first component and a second component which has a higher melting point than a eutectic point of the first component and the second component, and
 the second region contains a eutectic alloy of the first component and the second component.

2. The MEMS device according to claim 1, wherein the first region and the third region include the hyper-eutectic alloy.

3. The MEMS device according to claim 2, wherein
 the first component and the second component have a eutectic point at 400° C. to 600° C., and
 one of the first component and the second component has a melting point higher than 600° C.

4. The MEMS device according to claim 3, wherein the first component is aluminum.

5. The MEMS device according to claim 4, wherein the second component is one of germanium and silicon.

6. The MEMS device according to claim 1, wherein
 the first component and the second component have a eutectic point at 400° C. to 600° C., and
 one of the first component and the second component has a melting point higher than 600° C.

7. The MEMS device according to claim 6, wherein the first component is aluminum.

8. The MEMS device according to claim 7, wherein the second component is one of germanium and silicon.

9. The MEMS device according to claim 1, further comprising a height adjustment section between the bonding section and one of the first substrate and the second substrate.

10. The MEMS device according to claim 9, wherein the height adjustment section is a layer composed of a material which does not undergo a eutectic reaction with the first component or the second component.

* * * * *